United States Patent [19]
Hsu

[11] Patent Number: 5,631,650
[45] Date of Patent: May 20, 1997

[54] SAMPLE/HOLD FREE MOST SIGNIFICANT BIT COMPARATOR USING BISECTION COMPARATORS

[75] Inventor: Po-Chin Hsu, Taipei, Taiwan

[73] Assignee: Industrial Technology Research Institute, Hsinchu, Taiwan

[21] Appl. No.: 405,721

[22] Filed: Mar. 17, 1995

[51] Int. Cl.⁶ .................................................. H03M 1/42
[52] U.S. Cl. ........................................ 341/155; 341/156
[58] Field of Search .................................. 341/155, 156, 341/159

[56] References Cited

U.S. PATENT DOCUMENTS

| | | | |
|---|---|---|---|
| 4,733,217 | 3/1988 | Dingwall | 340/347 |
| 4,903,028 | 2/1990 | Fukushima | 341/156 |
| 5,298,814 | 3/1994 | Caruso | 341/156 |
| 5,399,919 | 3/1995 | Mair | 326/105 |

*Primary Examiner*—Jeffrey A. Gaffin
*Assistant Examiner*—Peguy JeanPierre
*Attorney, Agent, or Firm*—George O. Saile; Larry J. Prescott

[57] ABSTRACT

This invention provides an analog to digital converter using bisection comparators to determine the Most Significant Bits of the input voltage. The bisection comparator is comprised of three inverting amplifiers and does not use an auto zero phase, which reduces the power dissipation in the bisection comparator significantly. The bisection comparator does not use a sample and hold circuit and no capacitors are required, which significantly reduces the size of the integrated circuit chip. The analog to digital converter uses a number of bisection comparators to determine the Most Significant Bits of the input voltage and fine analog to digital converters to determine the Least Significant Bits of the input voltage. The outputs of the bisection comparators are used to set the switches of the fine analog to digital converters.

13 Claims, 7 Drawing Sheets

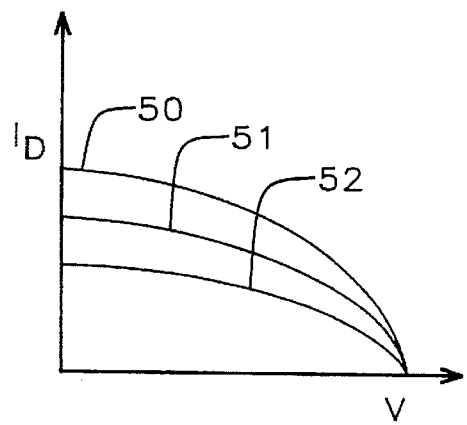
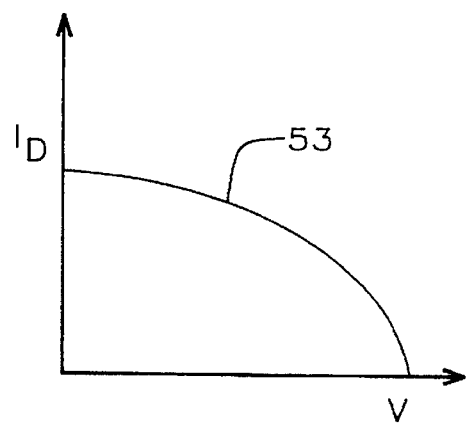
FIG. 5A      FIG. 5B
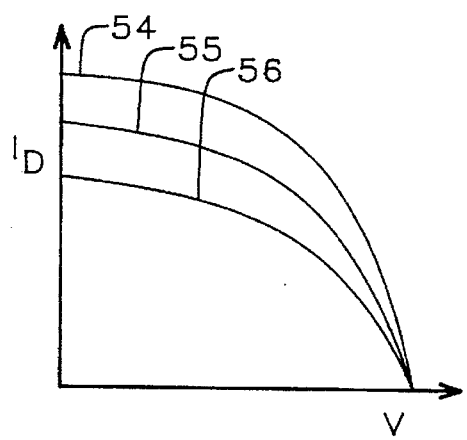
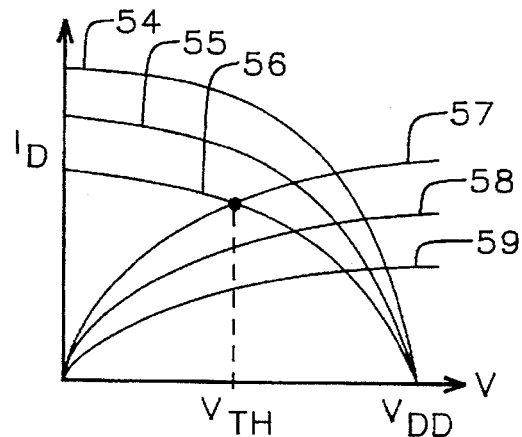
FIG. 5C      FIG. 5D

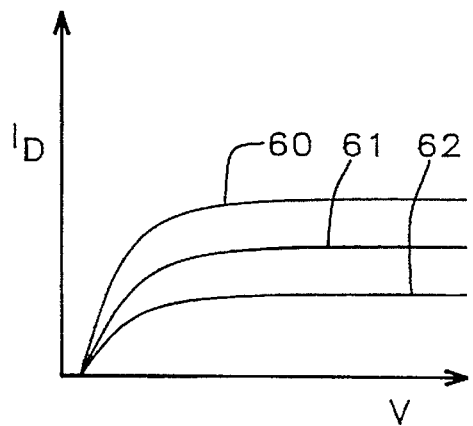
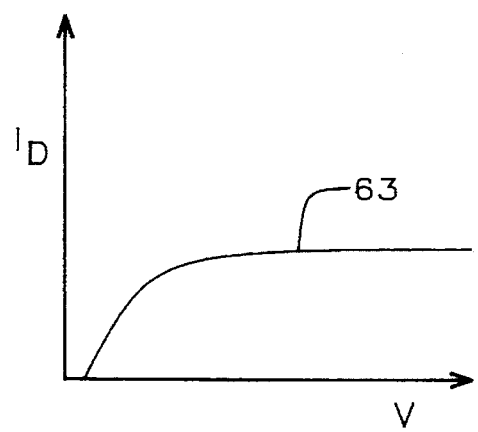
FIG. 6A  FIG. 6B
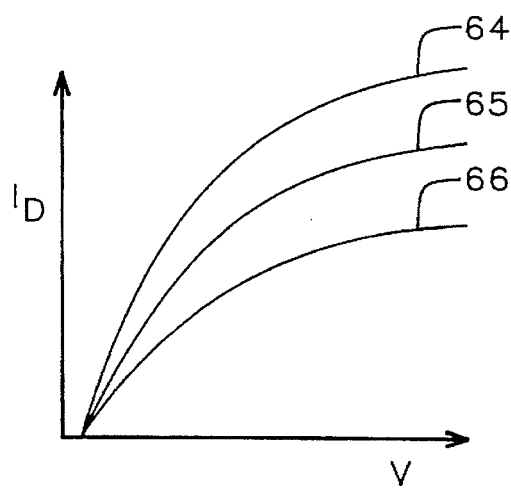
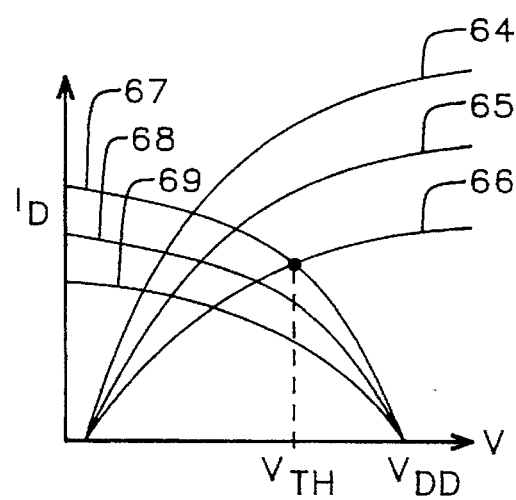
FIG. 6C  FIG. 6D

SAMPLE/HOLD FREE MOST SIGNIFICANT BIT COMPARATOR USING BISECTION COMPARATORS

BACKGROUND OF THE INVENTION (1) Field of the Invention

This invention relates to comparators used in analog to digital converters and to analog to digital converters using the comparators. The bisection comparator of this invention uses three inverting amplifiers. No auto zero phase is used in the bisection comparator. There is no sample/hold in the bisection comparator and capacitors are not used.

(2) Description of Related Art

An auto zero comparators are the most widely used comparators in CMOS Flash analog to digital converters and Two Step analog to digital converters. U.S. Pat. No. 4,903,028 to Fukushima describes a two step analog to digital converter using a plurality of resistors. U.S. Pat. No. 5,298,814 to Caruso describes comparators using inverting amplifiers with an auto zero phase. U.S. Pat. No. 4,733,217 to Dingwall describes two step analog to digital converters.

Conventional analog to digital converters use sample and hold circuits which require capacitors. These capacitors are large and require large integrated circuit elements. Conventional analog to digital converters using comparators with inverting amplifiers use an auto zero phase to bias the inverting amplifiers at the threshold voltage where the current and the power dissipation in the inverting amplifier is greatest. The bisection comparator of this invention does not use either an auto zero phase or a capacitor for a sample hold circuit. The bisection comparator of this invention has less power dissipation and is smaller than conventional comparators.

SUMMARY OF THE INVENTION

The block diagram of a conventional two stage analog to digital converter is shown in FIG. 1. The two stage analog to digital converter uses a coarse analog to digital converter 10 and two fine analog to digital converters 12 and 14. The coarse analog to digital converter 10 determines the Most Significant Bits of the analog voltage input 18 and stores the Most Significant Bits in a buffer 16. The fine analog to digital converters 12 and 14 determine the Least Significant Bits of the analog voltage input 18 and stores the Least Significant Bits in the buffer 16. As shown in FIG. 2, a key part of the conventional analog to digital converter is a comparator comprising an inverting amplifier 21 with a capacitor 23 at the input to the inverting amplifier 21 to form a sample and hold circuit. The inverting amplifier has a feedback loop with a switch 22 to provide an auto zero phase wherein the inverting amplifier is biased at the threshold voltage.

The conventional inverting amplifier circuit has a problem of high power dissipation due to the auto zero phase when the inverting amplifier is biassed a threshold and the current in the inverting amplifier is a maximum. A further problem with the comparator shown in FIG. 2 is the capacitor 23 at the input to the inverting amplifier 21 which is necessary for sample and hold circuitry. The capacitor 23 is large and requires a large chip size when the comparator is incorporated in an integrated circuit element.

It is an object of this invention to provide a comparator, called a bisection comparator, which does not use capacitors and which does not use an auto zero phase in its operating cycle.

It is a further object of this invention to provide an analog to digital converter which uses bisection comparators to determine the Most Significant Bits of the digitized input voltage.

These objectives are achieved with a bisection comparator comprised of three inverting amplifiers made up of three P Channel MOS field effect transistors and three N Channel MOS field effect transistors. The analog input voltage is connected the input of the first inverting amplifier. The reference voltage is connected to the input of the second inverting amplifier. The outputs of the first and second inverting amplifiers are connected to the input of the third inverting amplifier. There is no auto zero phase used in the bisection comparator and no capacitors are used. When the analog input voltage plus the reference voltage are very close to full scale range the input of the third inverting amplifier is very near threshold and the output of the third inverting amplifier changes. The output of the third inverting amplifier can be used to determine the Most Significant Bits of the input voltage. The power dissipation of the comparator is reduced because no auto zero phase is used and the size of the integrated circuit element is reduced because no capacitors are required.

A further object of this invention is achieved by using a number, for example 16, of bisection comparators along with two fine analog to digital converters in an analog to digital converter. The bisection comparators determine the Most Significant Bits of the analog input voltage which are stored in a buffer. The output of the bisection comparators are also used to set the switches in the fine analog to digital converters which then determine the Least Significant Bits of the analog input voltage and store them in the buffer. The buffer output is then the digital value of the analog input voltage. The power dissipation of the analog to digital converter is reduced because no auto zero phase is used in the bisection comparator. The size of the integrated circuit element is reduced because no capacitors are required.

BRIEF DESCRIPTION OF THE DRAWINGS

FIG. 5A through FIG. 5D shows transfer function curves of the first two inverting amplifiers of the bisection comparator of this invention with the reference voltage at zero volts.

FIG. 6A through FIG. 6D shows transfer function curves of the first two inverting amplifiers of the bisection comparator of this invention with the reference voltage at five volts.

DESCRIPTION OF THE PREFERRED EMBODIMENTS

Figure 1:
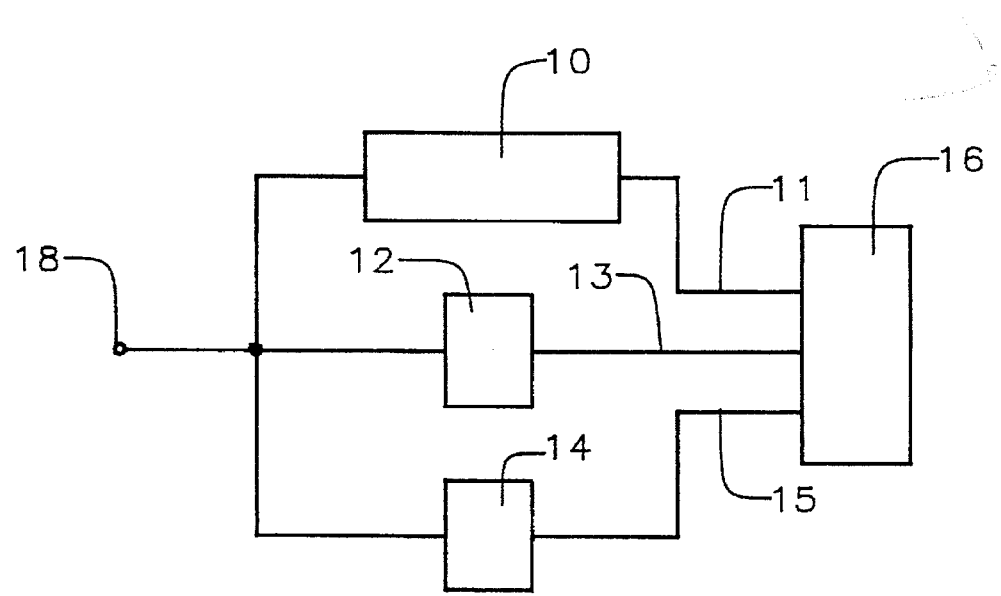
FIG. 1 shows a block diagram of a conventional analog to digital converter.
Figure 2:
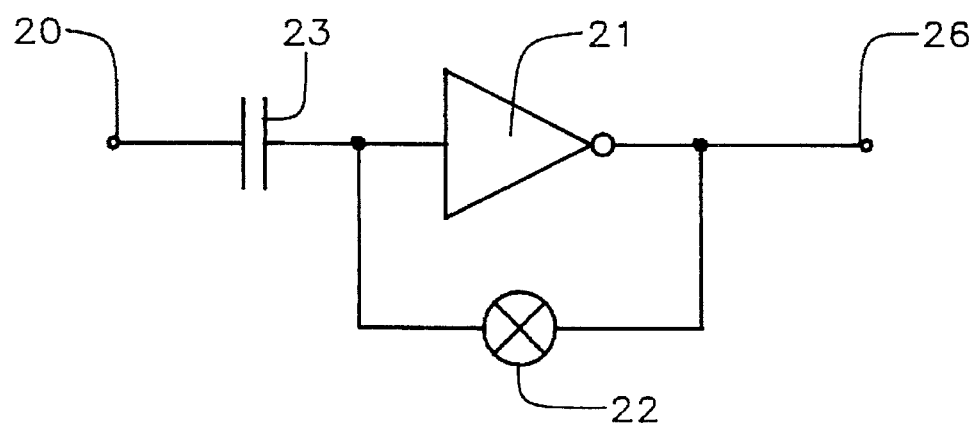
FIG. 2 shows a block diagram of a conventional comparator using an inverting amplifier and a capacitor.
Figure 3A:
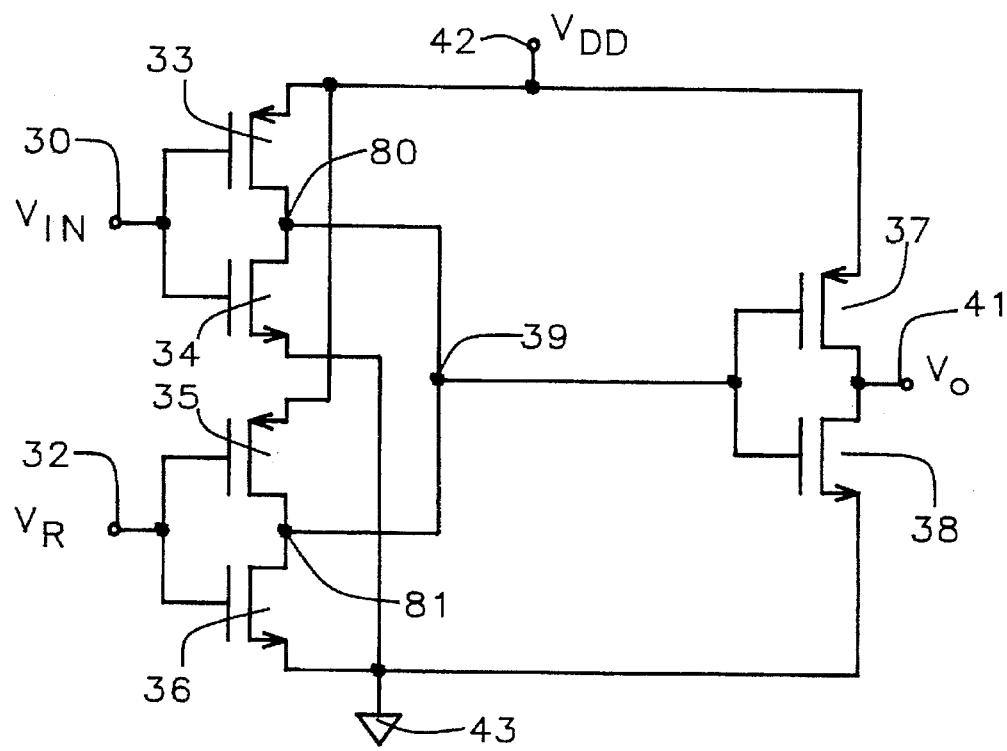
FIG. 3A shows a schematic diagram of the bisection comparator of this invention.

Refer now to FIG. 3A through FIG. 7, there is shown a preferred embodiment of this invention. FIG. 3A shows a schematic diagram of the bisection comparator comprising a first 33, second 34, third 35, fourth 36, fifth 37, and sixth 38 MOS field effect transistors. The first 33, third 35, and fifth 37 are P Channel MOS field effect transistors and the second 34, fourth 36, and sixth 38 are N Channel MOS field effect transistors. The source electrodes of the first 33, third 35, and fifth 37 P Channel MOS field effect transistors, or MOSFETs, are connected to the $V_{DD}$ voltage supply 42. The source electrodes of the second 34, fourth 36, and sixth 38 N Channel MOSFETs are connected to the $V_{SS}$ voltage supply 43. The drain electrodes of the first 33 and second 34 MOSFETs are connected to a first node 80 and the drains of the third 35 and fourth 36 MOSFETs are connected to a second node 81. The first node 80 and second node 81 are connected to an intermediate node 39.

The gate electrodes of the first 33 and second 34 MOSFETs are connected to the input voltage 30. The gate electrodes of the third 35 and fourth 36 MOSFETs are connected to the reference voltage 32. The gate electrodes of the fifth 37 and sixth 38 MOSFETs are connected to the intermediate node 39. The drain electrodes of the fifth 37 and sixth 38 MOSFETs are connected to the output voltage node 41.

Figure 3B:
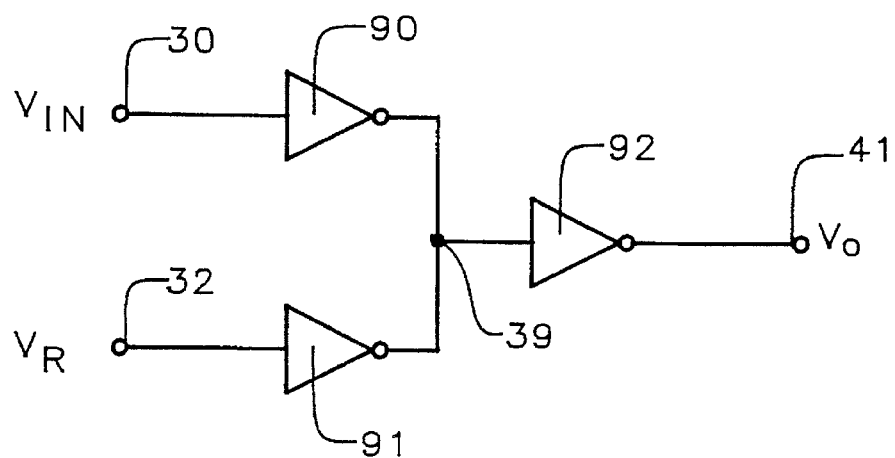
FIG. 3B shows a block diagram of the bisection comparator of this invention made up of three inverting amplifiers.

As shown in FIG. 3B the bisection comparator is comprised of three inverting amplifiers. The first 33 and second 34 MOSFETs make up the first inverting amplifier 90, the third 35 and fourth 36 MOSFETs make up the second inverting amplifier 91 and the fifth 37 and sixth 38 MOSFETs make up the third inverting amplifier 92. The input of the first inverting amplifier 90 is connected to the input voltage 30 and the input of the second inverting amplifier 91 is connected to the reference voltage 32. The output of the first 90 and second 91 inverting amplifiers are connected to the intermediate node 39 which is also connected to the input of the third inverting amplifier 92. The output of the third inverting amplifier 92 is the output voltage 41 of the bisection comparator. There is no auto-zero provision for these inverting amplifiers.

Figure 3C:
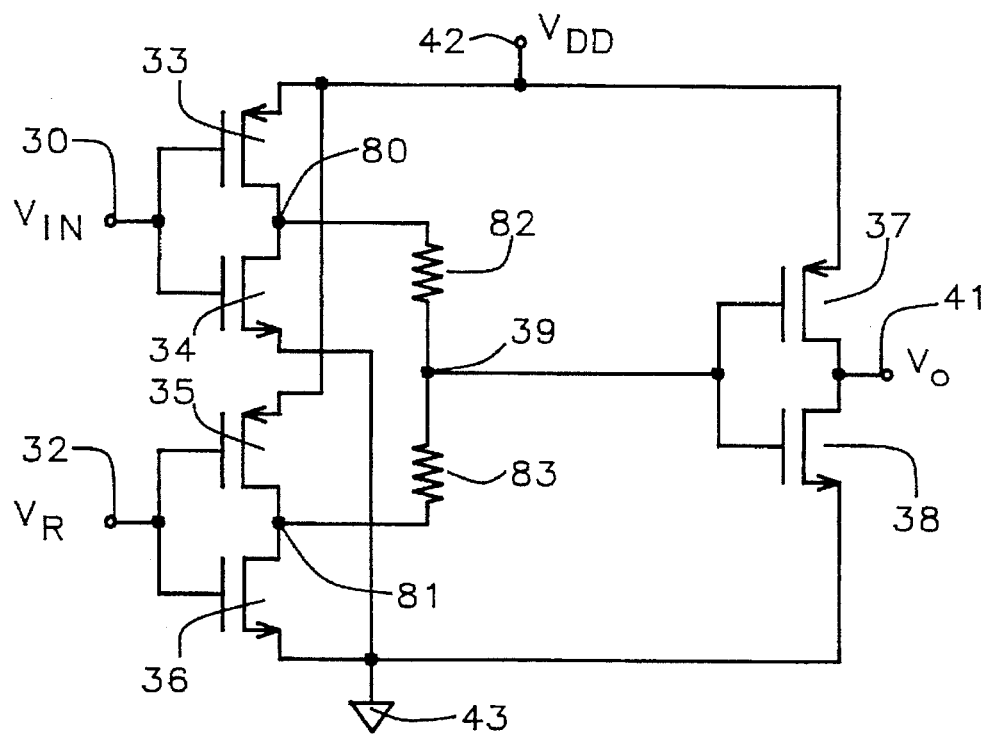
FIG. 3C shows a schematic diagram of the bisection comparator of this invention using resistors for short circuit protection.
Figure 4:
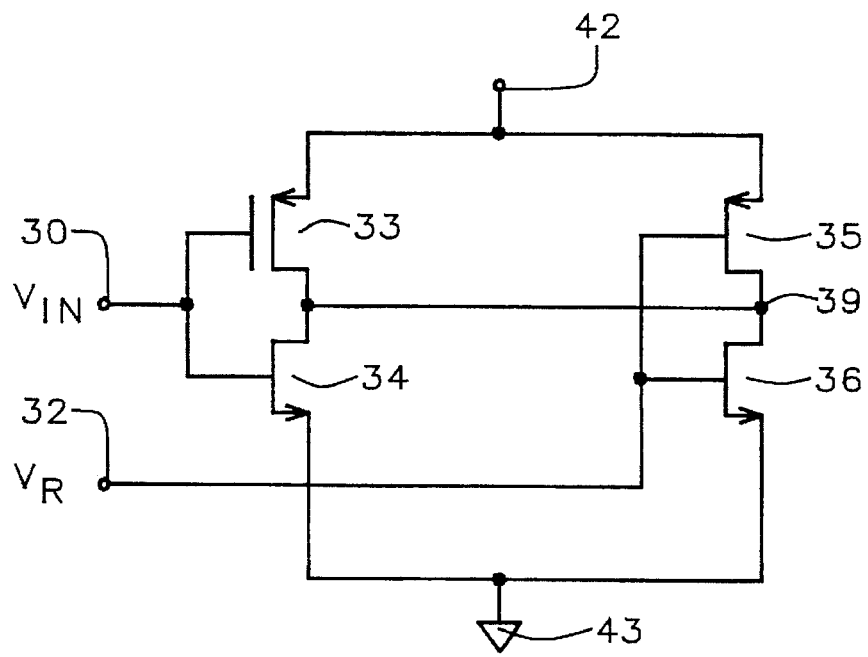
FIG. 4 shows a schematic diagram of the first two inverting amplifiers of the bisection comparator of this invention.

As shown in FIG. 3C a first resistor 82 of about 20 ohms can be connected between the first node 80 and the intermediate node 39 and a second resistor 83 of about 20 ohms can be connected between the second node 81 and the intermediate node 39. The purpose of the first 82 and second 83 resistors is short circuit protection and otherwise do not play any role in the operation of the bisection comparator.

Refer now to FIG. 4 through FIG. 6D for a description of the operation of the bisection comparator. The transfer curves shown in FIG. 5A through FIG. 5D are for the condition of the reference voltage 32 and the $V_{SS}$ voltage supply equal to zero. The transfer curves give the current into the $V_{DD}$ voltage node 42 as a function of the voltage between the $V_{DD}$ voltage node 42 and the $V_{SS}$ voltage node 43. Under these conditions current in the fourth MOSFET 36 is very nearly zero. The transfer curves for the first transistor 33 are shown in FIG. 5A for varying input voltage levels 50, 51, and 52. The input voltage for transfer curve 52 is greater than the input voltage for transfer curve 51 which is greater than the input voltage for transfer curve 50. FIG. 5B shows the transfer curve for the third MOSFET 35. The currents of the first MOSFET 33 and third MOSFET 35 combine in the second MOSFET 34 as shown in FIG. 5C. The transfer curves 57, 58, and 59 for the second MOSFET 34 are shown in FIG. 5D for varying input voltage. The input voltage for transfer curve 57 is greater than the input voltage for transfer curve 58 which is greater than the input voltage for transfer curve 59. The combined transfer curves 54, 55, and 56 for the first MOSFET 33 and third MOSFET 35 are also shown in FIG. 5D and the operating point must be the intersection of the curves at the appropriate input voltage.

The transfer curves shown in FIG. 6A through FIG. 6D are for the condition of the $V_{SS}$ voltage supply equal to zero and the reference voltage 32 equal to 5 volts. The transfer curves give the current into the $V_{DD}$ voltage node 42 as a function of the voltage between the $V_{DD}$ voltage node 42 and the $V_{SS}$ voltage node 43. Under these conditions current in the third MOSFET 35 is very nearly zero. The transfer curves for the second transistor 34 are shown in FIG. 6A for varying input voltage levels 60, 61, and 62. The input voltage for transfer curve 60 is greater than the input voltage for transfer curve 61 which is greater than the input voltage for transfer curve 62. FIG. 6B shows the transfer curve for the fourth MOSFET 36. The currents of the second MOSFET 34 and fourth MOSFET 36 combine in the first MOSFET 33 as shown in FIG. 6C. The transfer curves 67, 68, and 69 for the first MOSFET 33 are shown in FIG. 6D for varying input voltage. The input voltage for transfer curve 69 is greater than the input voltage for transfer curve 68 which is greater than the input voltage for transfer curve 67. The combined transfer curves 64, 65, and 66 for the second MOSFET 34 and fourth MOSFET 36 are also shown in FIG. 5D and the operating point must be the intersection of the curves at the appropriate input voltage.

As can be seen in FIG. 3B the input voltage is connected to the input of a first amplifying inverter 90 and the reference voltage is connected to the input of a second amplifying inverter 91. The outputs of the first and second amplifying inverters are connected to the input of a third amplifying inverter 92. When the input voltage plus the reference voltage are very close to full scale range the input to the third amplifying inverter 92 is very close to the threshold point and the third amplifying inverter will begin to change its state. This change of state is easily detected and the coarse level of the input voltage can be determined. There is no auto zero phase used for the amplifying inverters and the current and power consumption is substantially less than for the case where an auto zero phase is used.

Figure 7:
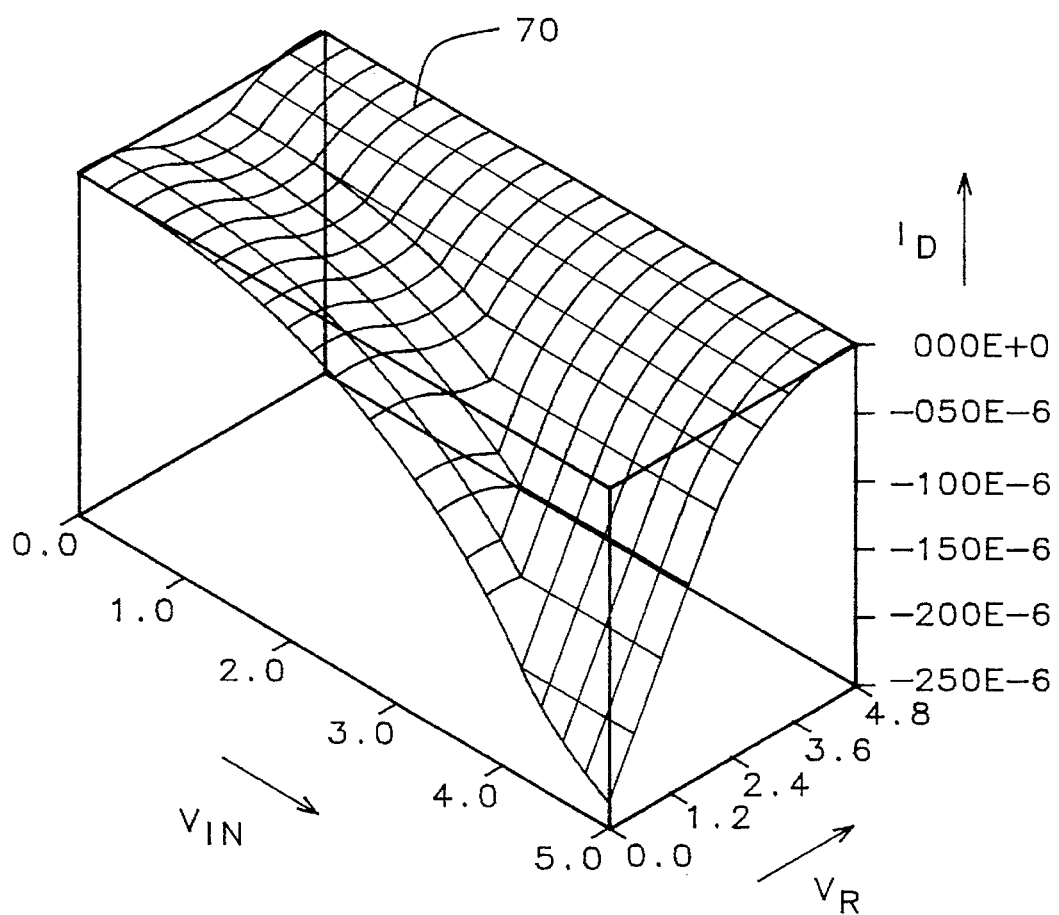
FIG. 7 shows the current in the first two inverting amplifiers of the bisection comparator of this invention as a function of input voltage and reference voltage.

The amplifying inverters are not biased at threshold points and their operating currents depend on the input voltage and the reference voltage. FIG. 7 shows the results of a computer simulation of current as a function of input voltage and reference voltage. The current distribution 70 of FIG. 7 represents the current supplied by the $V_{DD}$ voltage supply to the first and second amplifying inverters of the bisection comparator. The output of the bisection comparator can be used to determine the Most Significant Bits of an analog to digital converter. The output of the bisection comparator can also be used to determine which switches are to be turned on in a fine analog to digital converter in order to determine the Least Significant Bits of an analog to digital converter.

The power consumption of the bisection comparator are substantially less than for an auto zero type comparator. Computer simulation results showed the power dissipated by the bisection comparator to be less than one half that of an auto zero type comparator for the same test simulation conditions. The bisection comparator does not use sample and hold circuits so capacitors for the sample and hold circuits are not required resulting in much smaller chip sizes requirements.

Figure 8:
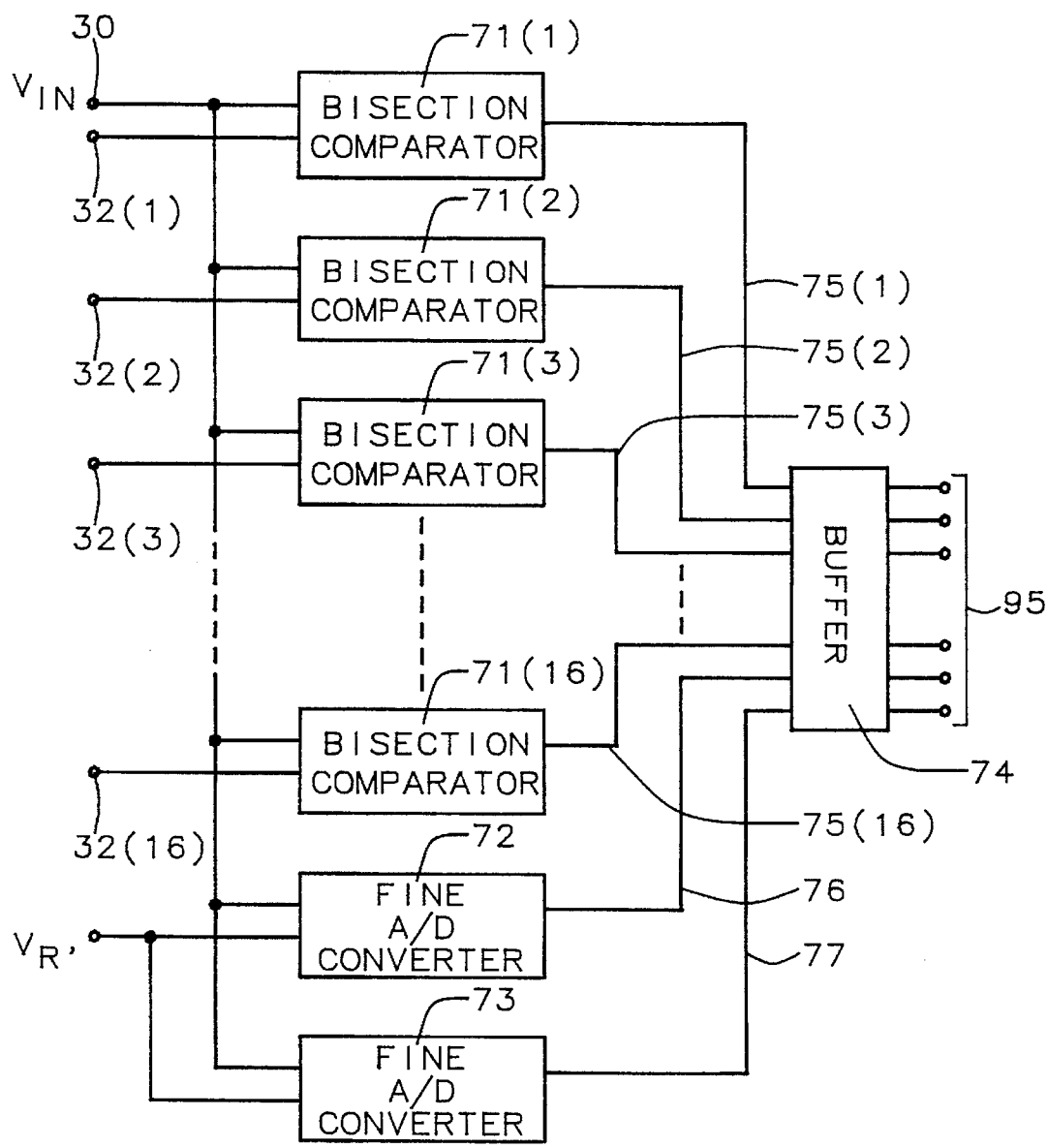
FIG. 8 shows a block diagram of an analog to digital converter comprising 16 bisection comparators and two fine analog to digital converters.

Refer now to FIG. 8, there is shown an embodiment of an analog to digital converter using the bisection comparator described in the previous embodiment. In this embodiment a number, for example 16 in this embodiment, of bisection comparators, 71(1), 71(2), 71(3), ..., 71(16) are used wherein each bisection comparator has an input voltage node, a reference voltage node, and an output node. The operation of the bisection comparators is as described in the previous embodiment. The analog to digital converter of this embodiment also has two fine analog to digital converters 72 and 73 wherein each fine analog to digital converter has an input voltage node, a reference voltage node, and an output node; and a buffer 74. The input voltage 30 to the analog to digital converter is connected to the input voltage nodes of the bisection comparators, 71(1), 71(2), 71(3), ..., 71(16), and to the input nodes of the fine analog to digital converters, 72 and 73. The reference voltages 32(1), 32(2), 32(3), ..., 31(16) to the analog to digital converter are connected to the reference voltage nodes of the bisection comparators, 71(1), 71(2), 71(3), ..., 71(16), and a set of reference voltages 33 are connected to the reference voltage nodes of the fine analog to digital converters, 72 and 73. The output nodes of the bisection comparators, 75(1), 75(2), 75(3), ..., 75(16), and the output nodes of the fine analog to digital converters 76 and 77 are connected to separate input nodes of the buffer 74. The output nodes of the bisection comparators, 75(1), 75(2), 75(3), ..., 75(16), are also connected to the fine analog to digital converters 72 and 73 to determine which switches are to be turned on in the fine analog to digital converters in order to determine the Least Significant Bits of the input voltage.

In the operation of the analog to digital converter of this embodiment the bisection comparator determines the Most Significant Bits of the input voltage and stores the information in the buffer. The two fine analog to digital converters use the output voltages from the bisection comparators to determine the switch settings of the fine analog to digital converters. The output of the two fine analog to digital converters then gives the Least Significant Bits of the input voltage and stores the information in the buffer 74. The outputs of the buffer 95 then provides the digitized input voltage.

As described in the previous embodiment the bisection comparators use amplifying inverters without using an auto zero phase and without sample hold circuits. This substantially reduces the power dissipation in the analog to digital converters and reduces chip size because capacitors needed for sample and hold circuits are not required.

While the invention has been particularly shown and described with reference to the preferred embodiments thereof, it will be understood by those skilled in the art that various changes in form and details may be made without departing from the spirit and scope of the invention.

What is claimed is:

1. A bisection comparator, comprising:
   a $V_{DD}$ voltage supply;
   a $V_{SS}$ voltage supply;
   a reference voltage supply;
   an input voltage;
   an output node;
   a first node;
   a second node;
   an intermediate node;
   a first P channel MOS field effect transistor having a first gate, a first source, and a first drain wherein said first source is connected to said $V_{DD}$ voltage supply, said first drain is connected to said first node, said first node is connected to said intermediate node, and said first gate is connected to said input voltage;
   a second N Channel MOS field effect transistor having a second gate, a second source, and a second drain wherein said second source is connected to said $V_{SS}$ voltage supply, said second drain is connected to said first node, and said second gate is connected to said input voltage;
   a third P Channel MOS field effect transistor having a third gate, a third source, and a third drain wherein said third source is connected to said $V_{DD}$ voltage supply, said third drain is connected to said second node, said second node is connected to said intermediate node, and said third gate is connected to said reference voltage supply;
   a fourth N Channel MOS field effect transistor having a fourth gate, a fourth source, and a fourth drain wherein said fourth source is connected to said $V_{SS}$ voltage supply, said fourth drain is connected to said second node, and said fourth gate is connected to said reference voltage supply;
   a fifth P Channel MOS field effect transistor having a fifth gate, a fifth source, and a fifth drain wherein said fifth source is connected to said $V_{DD}$ voltage supply, said fifth drain is connected to said output node, and said fifth gate is connected to said intermediate node; and
   a sixth N Channel MOS field effect transistor having a sixth gate, a sixth source, and a sixth drain wherein said sixth source is connected to said $V_{SS}$ voltage supply, said sixth drain is connected to said output node, and said sixth gate is connected to said intermediate node.

2. The bisection comparator of claim 1 wherein a first resistor is connected between said first node and said intermediate node, and a second resistor is connected between said second node and said intermediate node.

3. The bisection comparator of claim 1 wherein said $V_{SS}$ voltage supply is about zero volts.

4. The bisection comparator of claim 1 wherein the voltage of said $V_{DD}$ voltage supply is between about zero and 5 volts.

5. The bisection comparator of claim 1 wherein said input voltage is between about zero and the voltage of said $V_{DD}$ voltage supply.

6. The bisection comparator of claim 1 wherein said first P Channel MOS field effect transistor, said second N Channel MOS field effect transistor, said third P Channel MOS field effect transistor, said fourth N Channel MOS field effect transistor, said fifth P Channel MOS field effect transistor, and said sixth N Channel MOS field effect transistor are contained in a single integrated circuit element.

7. An analog to digital converter, comprising:
   a buffer;
   an input voltage;
   a number of fine analog to digital converters each said fine analog to digital converter having a fine input node and a fine output node wherein said fine input nodes are connected to said input voltage and said fine output nodes are connected to said buffer; and
   a number of bisection comparators for coarse analog to digital conversion wherein each said bisection comparator comprises:

a VDD voltage node;

a VSS voltage node;

a reference voltage node;

a course output node;

a first node;

a second node;

an intermediate node;

a first P Channel MOS field effect transistor having a first gate, a first source, and a first drain wherein said first source is connected to said VDD voltage node, said first drain is connected to said first node, said first node is connected to said intermediate node, and said first gate is connected to said input voltage;

a second N Channel MOS field effect transistor having a second gate, a second source, and a second drain wherein said second source is connected to said VSS voltage node, said second drain is connected to said first node, and said second gate is connected to said first gate of said first P Channel MOS field effect transistor;

a third P Channel MOS field effect transistor having a third gate, a third source, and a third drain wherein said third source is connected to said VDD voltage node, said third drain is connected to said second node, said second node is connected to said intermediate node, and said third gate is connected to said reference voltage node;

a fourth N Channel MOS field effect transistor having a fourth gate, a fourth source, and a fourth drain wherein said fourth source is connected to said VSS voltage node, said fourth drain is connected to said second node, and said fourth gate is connected to said reference voltage node;

a fifth P Channel MOS field effect transistor having a fifth gate, a fifth source, and a fifth drain wherein said fifth source is connected to said VDD voltage node, said fifth drain is connected to said coarse output node, and said fifth gate is connected to said intermediate node; and a sixth N Channel MOS field effect transistor having a sixth gate, a sixth source, and a sixth drain wherein said sixth source is connected to said VSS voltage node, said sixth drain is connected to said fifth drain of said fifth P Channel MOS field effect transistor, and said sixth gate is connected to said intermediate node.

8. The analog to digital converter of claim 7 wherein the number of fine analog to digital converters is two.

9. The analog to digital converter of claim 7 wherein a first resistor is connected between said first node and said intermediate node, and a second resistor is connected between said second node and said intermediate node of each said bisection comparator.

10. The analog to digital converter of claim 7 wherein said $V_{SS}$ voltage node of each bisectional comparator is connected to a voltage supply of about zero volts.

11. The analog to digital converter of claim 7 wherein said reference voltage node of each bisectional comparator is connected to a voltage supply of between about zero and 5 volts.

12. The analog to digital converter of claim 7 wherein said input voltage is between about zero and the voltage supplied to said $V_{DD}$ voltage node.

13. The analog to digital converter of claim 7 wherein each said bisection comparator is contained in a single integrated circuit element.

* * * * *